United States Patent [19]
Varadi

[11] 4,115,871
[45] Sep. 19, 1978

[54] MOS RANDOM MEMORY ARRAY

[75] Inventor: Andrew G. Varadi, Saratoga, Calif.

[73] Assignee: National Semiconductor Corporation, Santa Clara, Calif.

[21] Appl. No.: 788,871

[22] Filed: Apr. 19, 1977

[51] Int. Cl.² .................. G11C 11/24; G11C 7/02
[52] U.S. Cl. ................................. 365/149; 365/51
[58] Field of Search .................. 340/173 R, 173 CA; 365/149, 150, 206, 233, 208, 51

[56] References Cited

U.S. PATENT DOCUMENTS

| 3,699,537 | 10/1972 | Wahlstrom | 340/173 R |
| 3,838,404 | 9/1974 | Heeren | 340/173 R |

OTHER PUBLICATIONS

Sodini et al., "Enhanced Capacitor for One-Transistor Memory Cell," IEEE Transactions on Electron Devices, vol. Ed-23, No. 10, pp. 1187–1189, Oct. 1976.

Primary Examiner—Bernard Konick
Assistant Examiner—Donald McElheny

[57] ABSTRACT

This disclosure relates to an MOS random access memory array which utilizes a very small memory cell having a single MOS device and a small size, high capacitance, semiconductor capacitor device connected together to form one bit or memory cell of an MOS dynamic, random access memory array. Preferably, either the source or drain region of the MOS device is connected to the semiconductor portion of the semiconductor capacitor device which is of the electrode-insulator-semiconductor type. The semiconductor capacitor has a very high capacitance due to the use of a very shallow arsenic (N type) implanted region within a boron (P type) implanted region so that the PN junction formed is located where the concentration of Boron impurities is high thereby increasing the capacitance of the semiconductor capacitor. For each memory cell of the memory array, one of the active regions of the MOS device, for example, the source region, is connected to a Bit/Sense line of the memory array. The semiconductor portion of the semiconductor capacitor is connected to the drain region of the MOS device and the electrode plate of the semiconductor capacitor device that is not connected to the drain region of the MOS device is connected to a word line which word line is the next adjacent word line of the MOS random access memory array. The gate of the MOS device is connected up to the word line for that MOS device.

10 Claims, 3 Drawing Figures

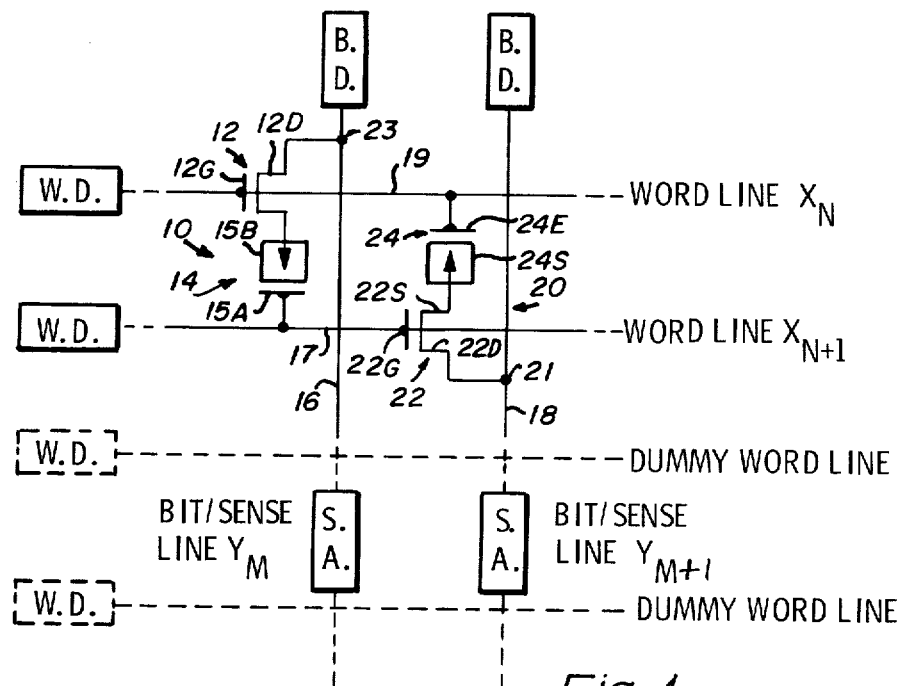
Fig_1
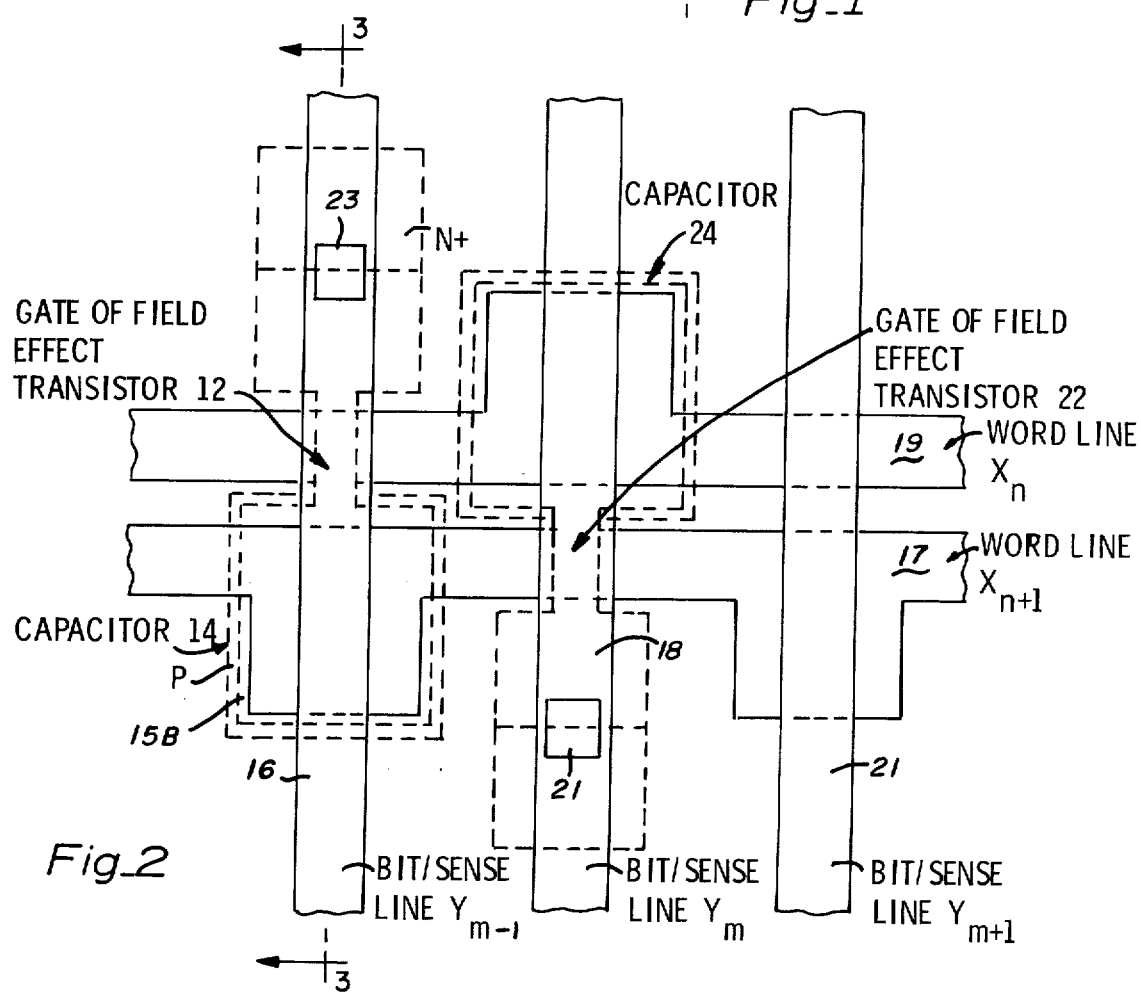
Fig_2

4,115,871

MOS RANDOM MEMORY ARRAY

BACKGROUND OF THE INVENTION

1. Field of the Invention

This invention relates generally to MOS memory arrays and, more particularly, to MOS random access memory arrays that utilize memory cells having a single MOS device connected to a semiconductor capacitor device as the storage element of the MOS random access memory array.

2. Description of the Prior Art

In the past, memory cell designs for MOS random access memory arrays have developed from the use of multiple devices (four and three MOS device cells) to the present use of a single MOS device with a semiconductor capacitor to provide a single bit or memory element.

Due to the drive in the semiconductor memory industry to reduce costs, increase memory bit capacity and have high reliability and yields, the size and design of each memory cell and the MOS and semiconductor capacitor device thereof that would be used in a memory array become extremely important. Thus, it became critical to achieve optimum use of a single MOS memory device in combination with a semiconductor capacitor device for incorporation in advanced, MOS random access memory array designs. For example, although most semiconductor memory companies presently manufacturing MOS random access memory arrays in high volume with large amounts of memory per chip or die have implemented the use of a simple memory cell having a single MOS device and a semiconductor capacitor device combined to function as their memory bit element, the reduction of the memory cell size has become a critical factor in achieving the goals of reduced costs, increased memory bit capacity and chip yields. As a consequence, most of the 4K bit MOS random access memory arrays that are in production today as well as the 16K bit MOS random access memory arrays that are being developed and placed into manufacture presently incorporate a memory cell design which utilizes a single MOS device and connected semiconductor capacitor device for the memory element; however, reduction of the memory cell size is dependent on reducing the size of one or both of the devices of this memory cell. Thus, a need existed to reduce the size of one of the devices of the memory cell and thereby reduce the overall size of the memory cell.

In implementing the so called one (MOS) device memory cell design which utilizes a single MOS device in combination with a semiconductor capacitor, the general memory array design tendency was to have the MOS device connected to one plate of the semiconductor capacitor device and the other plate of the semiconductor capacitor device connected to a separate $V_{DD}$ line that was utilized in the reading and writing operation for the memory cells of the MOS memory array (a separate $V_{DD}$ line was generally used for each column (or row) of a line of memory cells). An example of this type of prior art MOS memory array design using a single MOS device and a capacitor as the memory element or bit of the array is shown in U.S. Pat. No. 3,940,747 (see FIG. 3). Thus, as can be seen with reference to FIG. 3 and FIG. 4 of this prior art patent, a separate $V_{DD}$ line was needed and used to connect up one plate of each of the capacitors of a line (row or column) of MOS memory elements. This type of MOS memory array design was very disadvantageous from an overall size and therefore cost viewpoint because of the fact that every line of MOS memory cells required a separate $V_{DD}$ line. This resulted in the loss of a great deal of semiconductor or silicon real estate due to the need to tie one capacitor plate to a $V_{DD}$ for every memory element in each row (or column) of the MOS memory array.

Accordingly, MOS memory cell and array designers sought another way of building MOS random access memory arrays using the single device cell concept and eliminating the many $V_{DD}$ lines. U.S. Pat. No. 3,838,404 was an implementation of a MOS memory array design which eliminated the use of separate $V_{DD}$ lines tied to one plate of the semiconductor capacitor device of each memory element. As can be seen with reference to FIG. 3 of this patent, a memory cell is shown which utilizes a single MOS device and a connected capacitor device with the plate of the capacitor device that is not connected to the MOS device being electrically connected to the next line of memory cell units. However, there is no disclosure, teaching, or suggestion in this prior art patent of how to best implement and utilize this type of memory array with a smaller memory cell design. More specifically, this prior art patent does not disclose, teach or suggest how to reduce memory cell size by the use of a semiconductor capacitor device that is optimumly designed to have a high capacitance value and use less silicon real estate than prior semiconductor capacitor structures or designs so that the total MOS random access memory array can be designed smaller and at the same time have very good performance.

Thus, there was a need to develop a MOS random access memory cell array which utilizes both an optimum layout design eliminating $V_{DD}$ lines and a smaller size MOS memory element that uses less semiconductor real estate.

BRIEF DESCRIPTION OF THE DRAWING

FIG. 1 is a schematic type representation of the MOS random access memory array of this invention showing the connection of two separate adjacent MOS memory elements (with each element having a single MOS device and a semiconductor capacitor device) connected to the Word and Bit/Sense lines of the MOS random access memory array.

FIG. 2 is a top view of a portion of a MOS random access memory array semiconductor chip to show the layout arrangement of the Word lines, Bit/Sense lines, MOS devices, and semiconductor capacitor devices corresponding to the schematic representation of FIG. 1.

SUMMARY OF THE INVENTION

Figure 3:
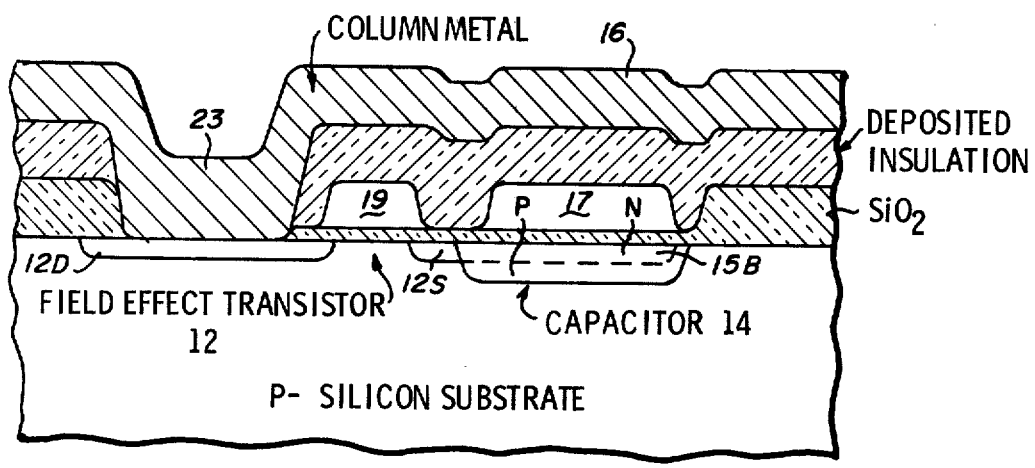
FIG. 3 is a cross-sectional elevational view taken on the line 3—3 of FIG. 2 showing one MOS memory cell or element (including MOS device and semiconductor capacitor device) with its interconnecting metal Bit/Sense line and doped polysilicon Word lines.

In accordance with one embodiment of this invention, it is an object of this invention to provide an improved MOS random access memory array.

It is another object of this invention to provide an improved random access MOS memory array which utilizes smaller size memory cells having a single MOS device and a connected semiconductor capacitor device.

It is a further object of this invention to provide a MOS random access memory array which utilizes a single MOS device and a connected semiconductor capacitor device with the semiconductor capacitor device having a design which produces an optimum capacitance value while using a minimum amount of semiconductor real estate.

DESCRIPTION OF THE PREFERRED EMBODIMENT

In accordance with a preferred embodiment of the invention, a MOS random access memory array is disclosed which comprises a plurality of interconnected memory cells. Means are provided for writing information into the memory cells. Means are also provided for reading information contained in the memory cells. Each of the memory cells comprises a MOS device having source and drain regions and a gate electrode, and a semiconductor capacitor device connected to the MOS device. The semiconductor capacitor device of each of the memory cells comprises a first semiconductor region of one conductivity type having a high resistivity, a second semiconductor region of the same one type conductivity located within a portion of the first semiconductor region extending inwardly from one surface thereof and having a lower resistivity than the resistivity of the first semiconductor region, and a region of opposite conductivity type located within the second semiconductor region and having a lower resistivity than the resistivity of the second semiconductor region. An insulating layer is located on the one surface and is in contact with the first and second regions of the same one conductivity type as well as the region of opposite conductivity type. An electrically conductive electrode is disposed on a portion of the insulating layer located over the region of opposite conductivity type. Contact means are connected to one of the source and drain regions of the MOS device. The electrically conductive electrode is one plate of the semiconductor capacitor device. The electrically conductive electrode is also connected to the gate electrode of another MOS device of one of the plurality of memory cells. The insulating layer is the dielectric of the semiconductor capacitor device and the region of opposite conductivity type is the other plate of the semiconductor capacitor device. The region of opposite conductivity type of the semiconductor capacitor device is in contact with the other of the source and drain regions of the MOS device. The gate electrode of the MOS device is in electrical contact with an electrically conductive electrode plate of another semiconductor capacitor device that is coupled to the other MOS device.

The foregoing and other objects, features and advantages of the invention will be apparent from the following more particular description of the preferred embodiments of the invention as illustrated in the accompanying drawing.

DETAILED DESCRIPTION

Referring to FIG. 1, a MOS random access memory array is shown. A single MOS semiconductor memory cell or element is generally designated by reference numeral 10. The MOS semiconductor memory element 10 has a MOS device generally designated by reference numeral 12 connected to a semiconductor capacitor device generally designated by reference numeral 14. The semiconductor capacitor device 14 has an electrode plate 15A and a semiconductor electrode plate 15B that is more clearly shown and described with reference to FIG. 3.

Associated with the semiconductor memory element 10 is a Bit/Sense line ($Y_M$) 16, a Word line ($X_{N+1}$) 17, and a Word line ($X_N$) 19. The Word line 19 is electrically connected to the gate 12G of the MOS device 12 as shown in FIG. 1. The Word line 17 is electrically connected to the electrode plate 15A of the semiconductor capacitor device 14 as is shown in FIG. 1. The source or drain (preferably the drain) region 12D of the MOS device 12 that is not connected to the semiconductor capacitor device 14 is electrically connected to the Bit/Sense line 16 at contact 23 (see also FIG. 3).

As can be seen with reference to FIGS. 1 and 2, an adjacent MOS memory element or cell 20 is shown connected to the Word line 19 by having its electrode plate 24E of semiconductor capacitor device 24 connected to the Word line 19. Drain region 22D of MOS device 22 that is not connected to semiconductor plate 24S of the semiconductor capacitor device 24 is electrically connected to the Bit/Sense line 18 at contact 21. Source region 22S of the MOS device 22 is electrically connected to the semiconductor plate 24S of the semiconductor capacitor device 24.

Referring to both FIGS. 2 and 3, it can be seen that the Bit/Sense line 16 is the upper metal layer that comes down to make electrical contact to the drain region 12D of the MOS device 12. This is done at contact 23 (see FIGS. 1, 2 and 3). The Word line 19 is shown both in FIGS. 2 and 3 as being underneath the metal Bit/Sense line 16 and orthogonal to the Bit/Sense line 16. Thus, the Word line 19 serves as the polysilicon gate electrode 12G for the field effect or MOS transistor 12 as shown on the left hand portion of FIGS. 2 and 3 and also serves as the polysilicon electrode capacitor plate 24E for the semiconductor capacitor device 24 which is associated with MOS or field effect transistor device 22. The other MOS memory elements are interconnected to Word and Bit/Sense lines as described above with respect to the memory cells 10 and 20.

It can also be seen from FIGS. 1, 2 and 3 that the Word line 17 serves as gate electrode 22G of the MOS transistor device 22 and is also the capacitor plate electrode 15A for the semiconductor capacitor device 14. There is only one electrical connection from the Bit/Sense line 16 to drain region 12D of the MOS device 12 by means of contact 23 as shown in both FIGS. 2 and 3. There is no need to provide an outside electrical contact to the semiconductor capacitor plate 15B region or to source region 12S of the MOS device 12 since the semiconductor capacitor plate 15B and the source region 12S are tied together underneath the insulating layer.

With reference to FIG. 3, the method for making the integrated semiconductor structure with the MOS semiconductor device 12 and connected semiconductor capacitor device 14 is disclosed in greater detail in the copending patent application (which is hereby incorporated herein by reference thereto) filed simultaneously herewith and entitled "Semiconductor Capacitor Especially Useful In An Integrated Semiconductor Structure With An MOS Device Including Fabrication Methods Therefor" and assigned to the same assignee of this patent application. A P type preferably Boron ion implanted semiconductor region is formed within a (P—) higher resistivity, semiconductor substrate region. A shallow, preferably Arsenic ion implanted, semiconductor region of opposite conductivity type (N) and lower resistivity is formed within the P type Boron implanted semiconductor region that is located within the higher resistivity P− semiconductor substrate region. An insulating layer is formed on a surface of the P type semiconductor region, the higher resistivity P− semiconductor substrate region and the shallow N type semiconductor region. Spaced polysilicon layer portions are formed on the surface of the insulating layer over the shallow semiconductor region of opposite conductivity type 15A (Word line 17), and over a portion of the P− higher resistivity semiconductor substrate region that is spaced from the shallow N type semiconductor region in order to be used as a self-aligned polysilicon gate electrode 12G (or Word line 19) for the MOS semiconductor device. Openings are formed in the insulating layer subsequently formed on opposite sides of the polysilicon gate electrode layer portion 12G (Word line 19) for source and drain regions. Source and drain regions are formed for the MOS semiconductor device 12 on opposite sides of the polysilicon gate electrode layer portion using the polysilicon gate electrode layer portion 12G (Word line 19) as a self-aligned mask which is doped during the process of forming the source and drain regions along with the polysilicon layer portion 15A (Word line 17) located over the shallow semiconductor region of opposite conductivity type to render both polysilicon layer portions electrically conductive. Electrical contacts to the memory cell are formed as shown. The electrically conductive polysilicon layer portion located over the shallow semiconductor region of opposite conductivity type serves as one electrode plate 15A of the semiconductor capacitor device 14. The portion of the insulating layer (preferably silicon dioxide) that is located over the region of opposite condutivity type (N region 15B) is the dielectric of the semiconductor capacitor device. The region of opposite conductivity type (N region 15B) is the other plate of the semiconductor capacitor device.

Thus, this semiconductor capacitor device structure 14 takes up semiconductor real estate and does not require precise tolerances while providing a high capacitance. This permits the entire memory array (especially with the smaller memory cell and without the need of separate $V_{DD}$ lines for each row (or column) of MOS memory cells) to be compacted. There is Referring to FIG. 1 the MOS memory array layout is shown to include Word Drivers (W.D.) and Bit Drivers (B.D.) respectively located on the Word and Bit/Sense lines of the memory array. Sense amplifiers (S.A.) are located on the Bit/Sense lines of the memory array as shown. On each side of each sense amplifier is a Dummy word line with the Dummy word line on the left side portion of each sense amplifier being a complement of the other Dummy line on the right side portion of each sense amplifier. The Dummy word lines that are used on opposite sides of each sense amplifier are basically the same type of Word lines as are the other Word lines of the memory array except that the semiconductor capacitor devices in the memory cells associated with the Dummy word lines are smaller.

The function and operation of the memory array as shown and disclosed in this specification is described below.

WRITING OPERATION

In carrying out a writing operation to place either a "1" or a "0" state in a particular memory cell of the memory array, it is necessary to apply differential voltages to the word line that is connected to the selected memory cell and the Bit/Sense line that is also connected to the selected memory cell.

Thus, for example, to write a "0" into the selected memory cell, the Bit/Sense line is at ground potential (0 Volts), the gate of the MOS device of the selected memory cell (by means of the word line) is at 12 Volts, and the source region of the MOS device (which is connected to the N region of the semiconductor capacitor device) is at ground potential (0 Volts).

In writing a "1" into the selected memory cell, a potential of 8 Volts is applied to the Bit/Sense line connected to the drain of the MOS device of the selected memory cell. The gate of the MOS device of the selected memory cell is at 12 Volts which turns the MOS device on and the source region of the MOS device is now at 8 Volts. This 8 Volts is trapped at the source region (or the connected semiconductor portion of the semiconductor capacitor device) when the 12 Volt potential on the gate electrode of the MOS device is removed which occurs after the writing operation is completed and the 12 Volts applied to the selected word line is removed (usually applied for about 20–30 nanoseconds).

READING OPERATION

In carrying out a reading operation to determine whether there are "1" or "0" states that have been written into each of the memory cells, it is necessary to use the Bit/Sense lines that are connected to a row (or column) of memory cells. In reading, a potential of, for example, 12 Volts is initially applied to each Bit/Sense line and then turned off. This serves to preset the Bit/Sense lines to a potential of 12 Volts.

Then, for example, a 12 Volt potential signal is applied to a selected word line. At the same time that the 12 Volt potential signal is applied to a selected word line, a 12 Volt potential signal is also applied to the Dummy word line that is located on the opposite side of the Sense Amplifier from the selected word line. Each memory cell which has a MOS device and its associated capacitor that is connected to the selected word line functions effectively as a capacitor.

Thus, for example, a node 23 (associated with the memory cell that has the MOS device 12 and the semiconductor capacitor 14) of the Bit/Sense line 16, a potential of 0 volts is applied to this node 23 by the capacitor acting memory cell if a "0" was stored or written into the memory cell and a potential of 8 volts is applied to this node 23 by the capacitor acting memory cell if a "1" was stored or written into the memory cell. Due to the fact that there is charge sharing at node 23 with the 12 Volt potential that has already been applied to the Bit/Sense line as described above, the input voltage applied to the Sense Amplifier associated with the Bit/Sense line is either at 11.0 volts (a slight voltage dop occurs because of the resistance on the Bit/Sense line) where a "0" was written into a memory cell connected to the Bit/Sense line or 11.5 volts where a "1" was previously written into the memory cell.

Since the Dummy word line on the opposite side of the Sense Amplifier, which was also selected with the selected word line, has memory cells (but with smaller capacitors) like the selected word line, the input voltage into the Sense Amplifier from the Bit/Sense lines associated with the Dummy word line is at +11.25 Volt which is intermediate the input 11.0 Volts (for a "0") or the 11.5 Volts (for a "1") on the opposite side of the Sense Amplifier. Thus, the Sense Amplifier sees either a +0.25 Volts if there was a Logic "1" written into a memory cell on said Bit/Sense line or −0.25 Volts if there was a Logic "0" written into the memory cell.

Thus, when carrying out a reading operation, only one word line at a time is energized with +12 Volts. If it is desired to read the adjacent word line, then only that word line is energized with +12 Volts and the +12 Volt potential is removed from the other word line.

However, due to the interconnection arrangement of this MOS random access memory array, reading of the adjacent word line causes +12 Volts to be applied to the polysilicon electrode plate of the semiconductor capacitor which adds together to provide either +12 Volts (for a Logic "0") or +20 Volts (for a Logic "1"). This is only a temporary condition however since the +12 Volt potential applied to the adjacent word line is removed when reading the first word line and the reading operation described earlier then applies.

In summary, in carrying out a writing operation, the Bit/Sense line is used to place a potential of either 0 (for a Logic "0") or 8 Volts (for a Logic "1") on the semiconductor capacitor of the selected memory cell. In reading, the signal on the Bit/Sense line connected to the selected memory cell is sensed to indicate a "1" or "0" memory cell state depending on the voltage left on the semiconductor capacitor from the previous writing operation.

While the invention has been particularly shown and described with reference to the preferred embodiments above, it will be understood by those skilled in the art that the foregoing and other changes in the form and details may be made therein without departing from the spirit and scope of the invention.

I claim:

1. An MOS random access memory array comprising, in combination, a plurality of interconnected memory cells, means for writing information into said memory cells, means for reading information contained in said memory cells, each of said memory cells comprising an MOS device having source and drain regions and a gate electrode and a semiconductor capacitor device connected to said MOS device, said semiconductor capacitor device of each of said memory cells comprising a first semiconductor region of one conductivity type having a high resistivity, a second semiconductor region of said one conductivity type located within a portion of said first semiconductor region extending inwardly from one surface thereof and having a lower resistivity than the resistivity of said first semiconductor region, a region of opposite conductivity type located within said second semiconductor region and having a lower resistivity than the resistivity of said second semiconductor region, an insulating layer located on said one surface and in contact with said first and second regions of said one conductivity type and said region of opposite conductivity type, an electrically conductive electrode disposed on a portion of said insulating layer located over said region of opposite conductivity type, and contact means connected to one of the source and drain regions of said MOS device, said electrically conductive electrode being one plate of the semiconductor capacitor device, said electrically conductive electrode being connected to the gate electrode of another MOS device of one of said plurality of memory cells, said insulating layer being the dielectric of the semiconductor capacitor device, and said region of opposite conductivity type being the other plate of the semiconductor capacitor device, said region of opposite conductivity type of the semiconductor capacitor device being in contact with the other of said source and drain regions of said MOS device, said gate electrode of said MOS device being in electrical contact with an electrically conductive electrode plate of another semiconductor capacitor device coupled to said another MOS device, a plurality of word lines and a plurality of bit/sense lines, each of said memory cells being connected to two adjacent word lines and one bit/sense line, each one of said memory cells having an adjacent memory cell, said each one of said memory cells being connected to one of said plurality of bit/sense lines and said adjacent memory cell being connected to another of said plurality of bit/sense lines.

2. An MOS random access memory array in accordance with claim 1 wherein said gate electrode of said MOS device being connected to one of said two adjacent word lines, said electrically conductive plate electrode of said capacitor device being electrically connected to the other of said two adjacent word lines, said contact means connected to one of the source and drain regions of said MOS device being also connected to said one bit/sense line.

3. An MOS random access memory array in accordance with claim 2 including word driver means connected to each of said plurality of word lines for applying a signal on a selected word line, and sense amplifier means connected to each of said plurality of bit/sense lines for sensing the magnitude of a signal on said bit/sense line.

4. An MOS random access memory array in accordance with claim 1, wherein said first semiconductor region of one conductivity type being a P- substrate region, said second semiconductor region of said one type conductivity being a P region, said region of opposite conductivity type being an N region, and the source and drain regions of said MOS device being of N+ type conductivity.

5. An MOS random access memory array in accordance with claim 4 wherein said second semiconductor region being a boron implanted P region, said region of opposite conductivity type being an arsenic implanted N region, and said source and drain regions of said MOS device being phosphorous diffused N+ regions.

6. An MOS random access memory array in accordance with claim 4 wherein the junction depth of said boron implanted second semiconductor region with said first semiconductor region being several times greater than the junction depth of said arsenic implanted region with said boron implanted second semiconductor region, the junction depth of said source and drain regions of said MOS device being greater than the junction depth of said arsenic implanted region.

7. An MOS random access memory array in accordance with claim 1 wherein said gate elecrode of said MOS device and said electrically conductive electrode of said semiconductor capacitor device being doped polysilicon elecrodes.

8. An MOS random access memory array in accordance with claim 1 wherein said electrically conductive electrode of said semiconductor device being located over said region of opposite conductivity type and confined within the area formed by the PN junction located between said second region of said one conductivity type and said region of opposite conductivity type.

9. An MOS random access memory array in accordance with claim 1 wherein said gate electrode of said MOS device being connected to one of said two adjacent word lines, said electrically conductive plate electrode of said capacitor device being electrically connected to the other of said two adjacent word lines, said contact means connected to one of the source and drain regions of said MOS device being also connected to said one bit/sense line, including word driver means connected to each of said plurality of word lines for applying a signal on a selected word line, and sense amplifier means connected to each of said plurality of bit/sense lines for sensing the magnitude of a signal on said bit/sense line, said gate electrode of said MOS device and said electrically conductive electrode of said semiconductor capacitor device being doped polysilicon electrodes, said electrically conductive electrode of said semiconductor capacitor being located over said region of opposite conductivity type and confined within the area formed by the PN junction located between said second region of said one conductivity type and said region of opposite conductivity type, said first semiconductor region of one conductivity type being a P- substrate region, said second semiconductor region of said one type conductivity being a P region, said region of opposite conductivity type being an N region, and the source and drain regions of said MOS device being of N+ type conductivity, said second semiconductor region being a boron implanted P region, said region of opposite conductivity type being an arsenic implanted N region, and said source and drain regions of said MOS device being phosphorous diffused N+ regions, the junction depth of said boron implanted second semiconductor region with said first semiconductor region being several times greater than the junction depth of said arsenic implanted region with said boron implanted second semiconductor region, the junction depth of said source and drain regions of said MOS device being greater than the junction depth of said arsenic implanted region.

10. An MOS random access memory array comprising, in combination, a plurality of interconnected memory cells, means for writing information into said memory cells, means for reading information contained in said memory cells, each of said memory cells comprising an MOS device having source and drain regions and a gate electrode and a semiconductor capacitor device connected to said MOS device, said semiconductor capacitor device of each of said memory cells having an electrically conductive electrode as one plate of the semiconductor capacitor device, said electrically conductive electrode being connected to the gate electrode of another MOS device of one of said plurality of memory cells, said gate electrode of said MOS device being in electrical contact with an electrically conductive electrode plate of another semiconductor capacitor device coupled to said another MOS device, a plurality of word lines and a plurality of bit/sense lines, each of said memory cells being connected to two adjacent word lines and one bit/sense line, each one of said memory cells having an adjacent memory cell, said each one of said memory cells being connected to one of said plurality of bit/sense lines and said adjacent memory cell being connected to another of said plurality of bit/sense lines.

* * * * *

UNITED STATES PATENT AND TRADEMARK OFFICE
CERTIFICATE OF CORRECTION

PATENT NO. : 4,115,871
DATED : September 19, 1978
INVENTOR(S) : Andrew G. Varadi It is certified that error appears in the above-identified patent and that said Letters Patent are hereby corrected as shown below:

Claim 9, line 16. After the word "capacitor" insert the word --device--.

Signed and Sealed this

Sixteenth Day of January 1979

[SEAL]

Attest:

RUTH C. MASON
Attesting Officer

DONALD W. BANNER
Commissioner of Patents and Trademarks